US012662430B2

(12) United States Patent
Hara et al.

(10) Patent No.: US 12,662,430 B2
(45) Date of Patent: Jun. 23, 2026

(54) Cr—Si—C-BASED SINTERED BODY

(71) Applicant: TOSOH CORPORATION, Shunan (JP)

(72) Inventors: Hiroyuki Hara, Ayase (JP); Masami Mesuda, Ayase (JP); Ayaka Masuda, Ayase (JP)

(73) Assignee: TOSOH CORPORATION, Shunan (JP)

( * ) Notice: Subject to any disclaimer, the term of this patent is extended or adjusted under 35 U.S.C. 154(b) by 672 days.

(21) Appl. No.: 18/007,203

(22) PCT Filed: Jul. 27, 2021

(86) PCT No.: PCT/JP2021/027671
§ 371 (c)(1),
(2) Date: Jan. 27, 2023

(87) PCT Pub. No.: WO2022/025033
PCT Pub. Date: Feb. 3, 2022

(65) Prior Publication Data
US 2023/0242452 A1 Aug. 3, 2023

(30) Foreign Application Priority Data

Jul. 31, 2020 (JP) ................................. 2020-129947
Apr. 5, 2021 (JP) ................................. 2021-063955

(51) Int. Cl.
*C04B 35/575* (2006.01)
*C04B 35/58* (2006.01)
(Continued)

(52) U.S. Cl.
CPC ...... *C04B 35/575* (2013.01); *C04B 35/58092* (2013.01); *C04B 35/62695* (2013.01); *C23C 14/3414* (2013.01)

(58) Field of Classification Search
CPC ...... C04B 35/58092; C04B 2235/3839; C04B 2235/3241; C04B 2235/3891;
(Continued)

(56) References Cited

FOREIGN PATENT DOCUMENTS

EP 0528416 A1 * 2/1993 ............. C04B 41/88
JP 7-86004 A 3/1995
(Continued)

OTHER PUBLICATIONS

EP-0528416-A1 machine translation (Year: 1993).*
(Continued)

*Primary Examiner* — Cameron K Miller
(74) *Attorney, Agent, or Firm* — Oblon, McClelland, Maier & Neustadt, L.L.P.

(57) ABSTRACT

An object of the present invention is to provide a high-density Cr—Si—C-based sintered body including chromium (Cr), silicon (Si) and carbon (C) and is furthermore to provide at least one of the high-density Cr—Si—C-based sintered body, a sputtering target including the sintered body or a method for producing a film using the sputtering target. The present invention can provide a Cr—Si—C-based sintered body including chromium (Cr), silicon (Si) and carbon (C), wherein the sintered body has a relative density of 90% or more and a porosity of 13% or less.

19 Claims, 1 Drawing Sheet

100

11

10

(51) Int. Cl.
*C04B 35/626* (2006.01)
*C23C 14/34* (2006.01)

(58) Field of Classification Search
CPC ........ C04B 2235/428; C04B 2235/721; C04B
2235/728; C23C 14/0682
See application file for complete search history.

(56) References Cited

FOREIGN PATENT DOCUMENTS

| | | | |
|----|----------------|----|---------|
| JP | 2002-173765 | A | 6/2002 |
| JP | 2003-167324 | A | 6/2003 |
| JP | 2004-325835 | A | 11/2004 |
| JP | 2013-502368 | A | 1/2013 |
| JP | 2017-82314 | A | 5/2017 |
| JP | 2017-218621 | A | 12/2017 |
| WO | WO 2011/022058 | A1 | 2/2011 |
| WO | WO 2020/105591 | A1 | 5/2020 |

OTHER PUBLICATIONS

International Search Report issued on Aug. 24, 2021 in PCT/JP2021/027671 filed on Jul. 27, 2021, 3 pages.
Extended European Search Report issued Aug. 13, 2024 in European Patent Application No. 21849756.8, 9 pages.
Yin X. et. Al., "Microstructure and oxidation resistance of carbon/silicon carbide composites infiltrated with chromium silicide", Materials Science and Engineering A290, Oct. 1, 2000, pp. 89-94, XP093182977.

* cited by examiner

100
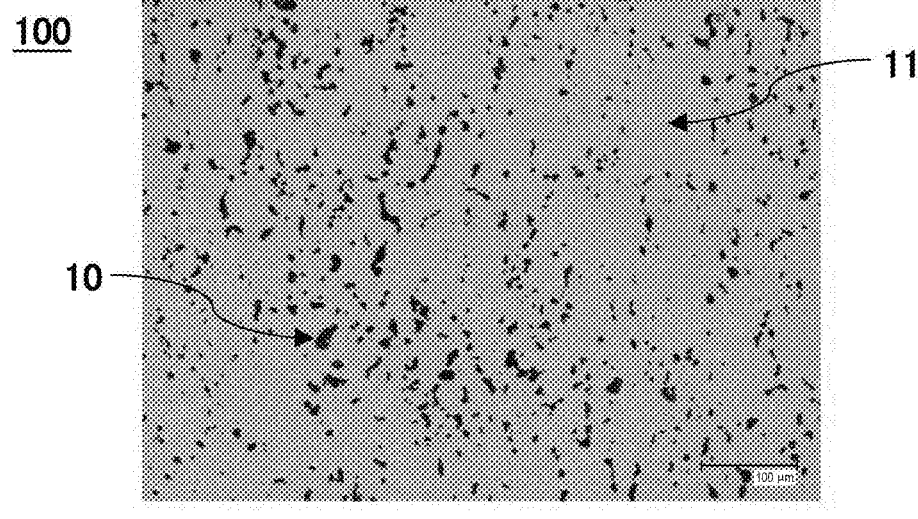

Cr—Si—C-BASED SINTERED BODY

CROSS-REFERENCE TO RELATED APPLICATIONS

The present application is a 35 U.S.C. § 371 national stage patent application of International patent application PCT/JP2021/027671, filed on Jul. 27, 2021, which is based on and claims the benefits of priority to Japanese Application No. 2020-129947, filed on Jul. 31, 2020, and Japanese Application No. 2021-063955, filed on Apr. 5, 2021. The entire contents of all of the above applications are incorporated herein by reference.

TECHNICAL FIELD

The present invention relates to a Cr—Si—C-based sintered body for forming a film.

BACKGROUND ART

In recent years, silicides represented by chromium silicides such as $CrSi_2$ have been used, because of their properties, as films (thin films) in a large number of applications such as semiconductors and solar cells. As the method for forming films, mainly thin films, the sputtering method is industrially often employed. However, in general, compositions containing silicides such as $CrSi_2$ (for example, sintered bodies) have low strength and hence undergo a phenomenon such as cracking during processing into sputtering targets or during discharging for forming films. Thus, it is known that compositions containing silicides are difficult to use as sputtering targets. Accordingly, in Patent Literature 1, the thermal spraying method is performed to produce a sputtering target constituted by Cr and Si crystal phases (alloy target mainly constituted by a Cr phase and a Si phase). However, sputtering targets produced by the thermal spraying method do not have sufficient strength in low-Cr-content composition regions. Similarly, sputtering targets produced using silicide-phase powder by the thermal spraying method also do not have sufficient strength.

In Patent Literature 2, the melting method is performed to produce a composition having a fine eutectic structure. However, such a composition obtained by the melting method has a low ratio of the eutectic structure and the composition region having a high ratio of the primary phase (specifically, a crystal phase accounting for the highest ratio in the composition) has insufficient strength. Furthermore, in the case of increasing the size of such a composition, because of the difference between the cooling rates of phases, the crystal structure is difficult to control and the composition as a whole has considerable variations in the strength.

Furthermore, silicide phases are brittle and hence Patent Literatures 3 and 4 do not refer to high-silicide-content systems.

In recent years, studies have been performed on, as a Cr—Si-based sputtering target in which temperature-change properties of the resistivity of the film (thin film) have been improved (specifically, the temperature dependency of the resistivity is reduced), a sputtering target using a sintered body provided by adding, to a Cr—Si-based sintered body, the third element such as carbon or boron. However, it is difficult to form such a sintered body so as to have high density. Thus, use of, as a sputtering target, such a sintered body to which the third element is added causes generation of a large amount of particles, so that film products are obtained at low yield, namely, productivity.

CITATION LIST

Patent Literature

PTL 1: Japanese Unexamined Patent Application Publication No. 2017-82314
PTL 2: Japanese Unexamined Patent Application Publication (Translation of PCT Application) No. 2013-502368
PTL 3: Japanese Unexamined Patent Application Publication No. 2002-173765
PTL 4: Japanese Unexamined Patent Application Publication No. 2003-167324

SUMMARY OF INVENTION

Technical Problem

An object of the present invention is to provide a high-density Cr—Si—C-based sintered body comprising chromium (Cr), silicon (Si) and carbon (C) and is furthermore to provide at least one of the high-density Cr—Si—C-based sintered body, a sputtering target comprising the sintered body or a method for producing a film using the sputtering target. In particular, an object of the present invention is to provide at least one of a Cr—Si—C-based sintered body in which generation of particles is suppressed, compared with the existing Cr—Si-based sintered bodies, a method for producing the Cr—Si—C-based sintered body, a sputtering target comprising the Cr—Si—C-based sintered body or a method for producing a film using the sputtering target.

Solution to Problem

The inventors of the present invention performed thorough studies on Cr—Si—C-based sintered bodies and their production processes. As a result, they have found that use of a quenched alloy powder (molten-metal powder) such as gas atomization powder provides a high-density Cr—Si—C-based sintered body and use of a Cr—Si—C-based sintered body having a specific structure as a sputtering target achieves suppression of generation of particles; thus, they have accomplished the present invention.

Specifically, the present invention is described in CLAIMS and the gist and embodiments of the present invention are as follows.

(1) A Cr—Si—C-based sintered body comprising chromium (Cr), silicon (Si) and carbon (C), wherein the sintered body has a relative density of 90% or more and a porosity of 13% or less.

(2) The Cr—Si—C-based sintered body according to (1), having a composition composed of 1 to 20 wt % of carbon, 20 to 70 wt % of silicon and the remainder being chromium.

(3) The Cr—Si—C-based sintered body according to (1) or (2), comprising chromium silicide and at least one selected from the group consisting of chromium carbide, silicon carbide and carbon.

(4) The Cr—Si—C-based sintered body according to any one of (1) to (3), wherein at least one selected from the group consisting of CrSi, $CrSi_2$ and $Cr_3Si$ is a main phase.

(5) The Cr—Si—C-based sintered body according to any one of (1) to (4), having an oxygen content of 1 wt % or less.

(6) The Cr—Si—C-based sintered body according to any one of (1) to (5), having a flexural strength of 100 MPa or more.

(7) A method for producing the Cr—Si—C-based sintered body according to any one of (1) to (6), the method comprising a step of mixing together a gas atomization powder of chromium and silicon and a carbon source containing at least one of chromium or silicon and carbon to obtain an alloy-raw-material powder and a baking step of hot-pressing the alloy-raw-material powder in a vacuum atmosphere, at a pressure of 50 MPa or less and a baking temperature of 1350° C. or more and 1800° C. or less.

(8) The production method according to (7), wherein the carbon source is a carbide containing at least one of chromium or silicon.

(9) A sputtering target comprising the Cr—Si—C-based sintered body according to any one of (1) to (6).

(10) A method for producing a film by sputtering using the sputtering target according to (9).

Advantageous Effects of Invention

The present invention can provide a high-density Cr—Si—C-based sintered body comprising chromium, silicon and carbon and can furthermore provide at least one of the high-density Cr—Si—C-based sintered body, a sputtering target comprising the sintered body or a method for producing a film using the sputtering target. Preferably, when a Cr—Si—C-based sintered body according to the present invention has a relative density of 90% or more and is used as a sputtering target, the amount of particles is small during the use as the sputtering target and high productivity can be achieved. In particular, the present invention can provide at least one of a Cr—Si—C-based sintered body in which generation of particles is suppressed, compared with the existing Cr—Si-based sintered bodies, a method for producing the Cr—Si—C-based sintered body, a sputtering target comprising the Cr—Si—C-based sintered body or a method for producing a film using the sputtering target.

BRIEF DESCRIPTION OF DRAWING

FIG. 1 laser-microscope observation image used for measurement of porosity

DESCRIPTION OF EMBODIMENTS

Hereinafter, examples of embodiments according to the present invention will be described in detail.

The present invention is a Cr—Si—C-based sintered body comprising chromium (Cr), silicon (Si) and carbon (C), wherein the sintered body has a relative density of 90% or more and a porosity of 13% or less.

The Cr—Si—C-based sintered body according to the present invention (hereafter, also referred to as "the sintered body according to the present invention") is a sintered body comprising chromium, silicon and carbon as main components and is preferably a sintered body composed of chromium, silicon and carbon.

The sintered body according to the present invention preferably comprises chromium silicide and at least one selected from the group consisting of chromium carbide, silicon carbide and carbon.

The chromium silicide that the sintered body according to the present invention comprises may be at least one selected from the group consisting of chromium monosilicides, disilicides and trisilicides, specifically at least one selected from the group consisting of CrSi, $CrSi_2$, $Cr_3Si$ and $Cr_5Si_3$ or more specifically at least one selected from the group consisting of CrSi, $Cr_3Si$ and $Cr_5Si_3$. The sintered body according to the present invention may comprise two or more chromium silicides, preferably comprises two or more selected from the group consisting of CrSi, $CrSi_2$, $Cr_3Si$ and $Cr_5Si_3$, more preferably comprises two or more selected from the group consisting of CrSi, $Cr_3Si$ and $Cr_5Si_3$ and still more preferably comprises CrSi or $Cr_3Si$ and $Cr_5Si_3$.

The sintered body according to the present invention preferably comprises at least one of chromium carbide ($Cr_3C_2$), silicon carbide (SiC) and carbon (C), more preferably at least one of silicon carbide or carbon, still more preferably silicon carbide.

The sintered body according to the present invention may be a sintered body composed of chromium silicide and at least one selected from the group consisting of chromium carbide, silicon carbide or carbon or may comprise, in addition to these, at least one of silicon (Si) or chromium (Cr) or alternatively silicon.

The sintered body according to the present invention preferably comprises chromium silicide as the main phase, more preferably comprise at least one selected from the group consisting of CrSi, $CrSi_2$ and $Cr_3Si$ as the main phase and still more preferably comprises CrSi as the main phase. In the present invention, the main phase is the crystal phase accounting for the highest ratio of the crystal phases of the sintered body; for example, the mass ratio of the crystal phase serving as the main phase to the mass of the sintered body may be more than 50 wt %, 60 wt % or more or 70 wt % or more. Furthermore, in the sintered body according to the present invention, the mass ratio (wt %) of chromium silicide may be, for example, 70 wt % or more or 75 wt % or more and 80 wt % or less or 95 wt % or less.

In the present invention, the crystal phases such as chromium silicide comprised in the sintered body can be identified using its powder X-ray diffraction (hereafter, also referred to as "XRD") pattern. The XRD pattern can be measured using an ordinary XRD apparatus (for example, RINT Ultima III, manufactured by Rigaku Corporation). Examples of the XRD measurement conditions in the present invention include the following conditions.

Accelerated current and voltage: 40 mA and 40 kV

Radiation source: CuKα radiation (λ=1.5405 Å)

Measurement mode: continuous scanning

Scanning condition: 2°/min

Measurement range: 2θ=20° to 80°

Divergence height limiting slit: 10 mm

Divergence/incident slit: ½°

Receiving slit: 0.3 mm

The obtained XRD pattern can be compared with the database of ICDD to thereby identify the crystal phases of the sintered body.

The sintered body according to the present invention has a feature of having a relative density of 90% or more, preferably 92% or more, more preferably 94% or more, particularly preferably 96% or more. The relative density may be 100% or less or 99% or less. In the case of a sintered body having a relative density of less than 90%, during formation of a film (specifically, during formation of a film using the sintered body), portions of the sintered body separate as coarse particles (in other words, particles are generated). As a result, in the sintered body, coarse pores (for example, pores having the largest length of 50 μm or more; hereafter, also referred to as "coarse pores") are formed. Simultaneously, the particles adhere as films during formation of a film (in other words, a film including the particles is formed). The film including the particles is not uniform in terms of physical properties and characteristics and hence cannot be used. Thus, sintered bodies having a relative density of less than 90% cause degradation of productivity of films.

In the present invention, "relative density" (%) is the ratio of measured density to true density and is a value calculated by (measured density [g/cm$^3$]/true density [g/cm$^3$])×100.

The measured density is the bulk density determined, in accordance with JIS R 1634, from the dry mass relative to the volume measured by the Archimedes' method. The pretreatment prior to the Archimedes' method is preferably performed by the boiling method and the sintered body can be boiled in water.

The true density is the density calculated by the following formula.

$$d=1/\{(R_1/M_1)+(R_2/M_2)+(R_3/M_3)+(R_4/M_4)+(R_5/M_5)+(R_6/M_6)+(R_7/M_7)+(R_8/M_8)+(R_9/M_9)\}$$

In this formula, d is the true density [g/cm$^3$] of the sintered body and $M_1$ to $M_8$ and $R_1$ to $R_8$ are respectively the true densities [g/cm$^3$] of crystal phases of Si, C, Cr, SiC, CrSi, $CrSi_2$, $Cr_3Si$, $Cr_3C_2$ and $Cr_5Si_3$ comprised in the sintered body and the mass ratios [wt %] of the crystal phases in the sintered body.

The true densities of the crystal phases can be values of the crystal phases described in ICDD (Version 2.1502). Examples of the values of the true densities are as follows.

Si: 2.33 g/cm$^3$ (=$M_1$)
C: 2.28 g/cm$^3$ (=$M_2$)
Cr: 7.20 g/cm$^3$ (=$M_3$)
SiC: 3.12 g/cm$^3$ (=$M_4$)
CrSi: 5.36 g/cm$^3$ (=$M_5$)
$CrSi_2$: 4.98 g/cm$^3$ (=$M_6$)
$Cr_3C_2$: 6.66 g/cm$^3$ (=$M_7$)
$Cr_5Si_3$: 5.87 g/cm$^3$ (=$M_8$)
$Cr_3Si$: 6.46 g/cm$^3$ (=$M_9$)

Note that the numbers of the crystal phases in ICDD are as follows: Si corresponds to 00-026-1481, C corresponds to 00-026-1080, Cr corresponds to 01-077-759, SiC corresponds to 00-002-105, CrSi corresponds to 03-065-3298, $CrSi_2$ corresponds to 01-072-6184, $Cr_3C_2$ corresponds to 01-071-2287, $Cr_5Si_3$ corresponds to 01-072-0347 and $Cr_3Si$ corresponds to 01-070-301.

The mass ratios of the crystal phases are the mass ratios [wt %] of the crystal phases determined from the crystal phases of the sintered body identified using an XRD) pattern measured under the above-described conditions and the ratios of the elements (Cr, Si and C) constituting the sintered body. For example, when the crystal phases included in the XRD pattern of a sintered body are CrSi, $Cr_5Si_3$ and SiC and the composition of the sintered body determined by composition analysis has X mol % of Cr, Y mol % of Si and Z mol % of C, the molar ratios [mol %] calculated by the following formulas are multiplied by the true densities of the crystal phases to provide the mass ratios [wt %].

$$X=1\times M_{CrSi}+5\times M_{Cr5Si3}$$

$$Y=1\times M_{CrSi}+3\times M_{Cr5Si3}+1\times M_{SiC}$$

$$Z=1\times M_{SiC}$$

In these formulas, $M_{CrSi}$ is the molar ratio [mol %] of CrSi, $M_{Cr5Si3}$ is the molar ratio [mol %] of $Cr_5Si_3$ and $M_{SiC}$ is the molar ratio [mol %] of SiC.

The true density of the sintered body according to the present invention including three crystal phases (crystal phases A to C) can be calculated by the following formula.

$$d=(a+b+c)/((a/Ma)+(b/Mb)+(c/Mc))$$

or $$d=1/((Ra/Ma)+(Rb/Mb)+(Rc/Mc))$$

In these formulas, d is the true density [g/cm$^3$] of the sintered body; a, b and c are respectively the masses [g] of the crystal phases A, B and C included in the sintered body; Ma, Mb and Mc are respectively the true densities [g/cm$^3$] of the crystal phases A, B and C included in the sintered body; Ra, Rb and Rc are respectively the mass ratios [wt %] of the crystal phases A, B and C included in the sintered body. The crystal phases A, B and C are three species selected from the group consisting of Si, C, Cr, SiC, CrSi, $CrSi_2$, $Cr_3C_2$ and $Cr_5Si_3$, preferably (1) CrSi, $Cr_5Si_3$ and SiC, (2) $Cr_3Si$, $Cr_5Si_3$ and SiC or (3) $CrSi_2$, Si and C, more preferably CrSi, $Cr_5Si_3$ and SiC.

The sintered body according to the present invention has a feature of having a porosity of 13% or less. In the case where the porosity is more than 13%, at the time of formation of a film (specifically, at the time of using the sintered body for forming a film), the productivity of the film sharply degrades. In order to achieve stably high productivity, the porosity is preferably 8% or less, more preferably 6% or less, particularly preferably 4% or less. The sintered body according to the present invention may include pores, but preferably does not include pores (in other words, have a porosity of 0%); the sintered body according to the present invention has, for example, a porosity of 0% or more, more than 0%, 0.5% or more or 1% or more.

In the present invention, "porosity" is the ratio of pores determined from an observation image of the surface of a sintered body and is the ratio of pores measured by image analysis of an observation image of the surface of a sintered body having a surface roughness Ra≤0.02 μm. The porosity can be determined from an observation image of the surface of a sintered body before or after sputtering and is preferably determined from an observation image of the surface of a sintered body before or after sputtering. In the observation image, the shape of the pores is not limited and is, for example, a substantially spherical shape, a substantially polyhedral shape, or an amorphous shape. The observation image can be an observation image obtained by laser-microscope observation using an ordinary laser microscope (for example, VX-250, manufactured by Keyence Corporation). The observation conditions in the laser-microscope observation may be as follows.

Magnification in observation: 200×
Fields of view observed: 5 or more fields of view, preferably 5 to 8 fields of view, more preferably 5 fields of view FIG. 1 illustrates a single field of view in such an observation image obtained by laser-microscope observation. As illustrated in FIG. 1, in an observation image (100), pores are observed as a black region (10) and the sintered body is observed as a white region (11). The porosity (%) in each field of view can be determined as, in each observation image, the ratio (%) of the black regions to the total area of the black regions and the white region. The average of the porosities in the fields of view observed can be determined as the porosity in the present invention. The image analysis can be performed by, using a general-purpose image analysis software (for example, Image-Pro, manufactured by Media Cybernetics, Inc.), analyzing the obtained observation image. The image-analysis conditions may be conditions below. Note that the contrast ratio is a value selected from 0 to 100.

Fields of view measured: 5 or more fields of view, preferably 5 to 8 fields of view, more preferably 5 fields of view
    Contrast ratio: 100

The sintered body according to the present invention preferably has a silicon (Si) content in the range of 20 to 70 wt %, more preferably 25 to 65 wt %, more preferably 30 to 60 wt %, still more preferably 35 to 55 wt %. When the silicon content is less than 20 wt %, the sintered body as a whole tends to have a small amount of semiconductor phases (specifically, a SiC phase and a Si phase) and the resistivity tends to considerably vary depending on temperature. When the silicon content is more than 70 wt % or more than 50 wt %, the amount of semiconductor phases tends to be large and the resistivity of the resultant film tends to considerably vary depending on temperature. The sintered body according to the present invention preferably has a silicon content of 20 wt % or more, 25 wt % or more or 30 wt % or more, or 70 wt % or less, 65 wt % or less, 50 wt % or less, 45 wt % or less or 40 wt % or less.

In the sintered body according to the present invention, the silicon content is the mass ratio (wt %) of silicon to the mass of the sintered body according to the present invention determined by mass measurement. Silicon comprised in the sintered body according to the present invention can be measured by an ordinary method used in the present technical field and may be measured by, for example, the ICP analysis.

The sintered body according to the present invention preferably has a carbon (C) content in the range of 1 to 20 wt %, more preferably 1 to 15 wt %, still more preferably 1 to 10 wt %, yet more preferably 5 to 10 wt %. When the carbon content is less than 1 wt %, temperature-change properties of the resistivity of the film are not improved (specifically, the temperature dependency tends not to be reduced). On the other hand, when the carbon content is more than 20 wt %, the sintered body tends to have a large amount of a SiC phase exhibiting a high resistivity close to insulation and the SiC phase during DC discharging tends to cause generation of particles. The sintered body according to the present invention preferably has a carbon content of 1 wt % or more, 3 wt % or more or 4 wt % or more, or 20 wt % or less, 15 wt % or less, 10 wt % or less or 9 wt % or less.

In the sintered body according to the present invention, the carbon content is the mass ratio (wt %) of carbon to the mass of the sintered body. Carbon can be measured by an ordinary method used in the present technical field and, for example, the infrared absorption method after combustion can be performed using an ordinary carbon-sulfur analyzer (for example, LECO-CS844 carbon-sulfur analyzer) to measure the carbon.

As long as, in the sintered body according to the present invention, the remainder other than silicon and carbon is chromium, the sintered body according to the present invention has a chromium content of, for example, more than 10 wt % and less than 79 wt %, 15 to 75 wt % or 35 to 70 wt %. The sintered body according to the present invention preferably has a composition range of 1 to 20 wt % of carbon, 20 to 70 wt % of silicon, and the remainder being chromium.

The sintered body according to the present invention preferably comprises metallic elements (including metalloid elements; hereafter, the same definition in this DESCRIP- TION) that are chromium and silicon. However, the sintered body according to the present invention may comprise, in addition to chromium (Cr), silicon (Si) and carbon (C), metallic impurities such as iron (Fe) and aluminum (Al). The metallic elements such as iron and aluminum are comprised as unavoidable impurities. In other words, the sintered body according to the present invention may comprise unavoidable impurities and may comprise, as unavoidable impurities, metallic impurities (metallic elements other than chromium and silicon) or, as unavoidable impurities, iron and aluminum. The total content of such metallic impurities (metallic elements other than chromium and silicon) may be 1 wt % or less or is preferably 0.5 wt % or less, more preferably 0.3 wt % or less. The sintered body according to the present invention preferably does not comprise metallic impurities and the total content of metallic elements other than chromium and silicon can be 0 wt % or more, or more than 0 wt % or 0.1 wt % or more, for example.

In addition, the sintered body according to the present invention may comprise oxygen as long as properties in the case of using it as a sputtering target are not degraded. The sintered body according to the present invention preferably has a low oxygen (O) content that is preferably, for example, 1 wt % or less. When the oxygen content is more than 1 wt %, a large amount of particles derived from insulating oxides tend to be generated during formation of a film. More preferably, the sintered body according to the present invention has an oxygen content of 0.5 wt % or less, particularly preferably 0.1 wt % or less. The sintered body according to the present invention preferably does not comprise oxygen (in other words, the oxygen content is 0 wt %), but it can be more than 0 wt % or 0.01 wt % or more, for example.

In the sintered body according to the present invention, the oxygen content is the mass ratio (wt %) of oxygen to the mass of the sintered body. The oxygen comprised in the sintered body according to the present invention can be measured by an ordinary method used in the present technical field. For example, the oxygen content can be measured by analysis based on the infrared absorption method after fusion under inert gas. The infrared absorption method after fusion under inert gas can be performed using an ordinary oxygen-nitrogen analyzer (for example, LECO-ON736 oxygen-nitrogen analyzer).

The sintered body according to the present invention may have an appropriate shape corresponding to the purpose, for example, at least one selected from the group consisting of a disc shape, a cylindrical shape, a plate shape, a rectangular parallelepiped shape, a cubic shape, a polyhedral shape and a substantially polyhedral shape.

The sintered body according to the present invention preferably has a flexural strength of 100 MPa or more, particularly preferably 150 MPa or more. In the case of the flexural strength being in such a range, even when the sintered body according to the present invention is produced as a sintered body having a large size of more than 300 mm, generation of defects during processing such as the risk of cracking during processing can be reduced and furthermore generation of defects such as cracking during use as a sputtering target can also tend to be suppressed. The sintered body according to the present invention can have a flexural strength of 300 MPa or less, 250 MPa or 200 MPa or less, for example.

In the present invention, the flexural strength can be measured by the method in accordance with JIS R 1601.

A preferred embodiment of the sintered body according to the present invention may be a sintered body having features of having a porosity of 13% or less and comprising chromium silicide and at least one selected from the group consisting of chromium carbide, silicon carbide and carbon, wherein the porosity is preferably 11% or less, 10% or less or 6% or less and 0% or more, more than 0% or 0.3% or more. Furthermore, the chromium silicide preferably comprises at least two or more selected from the group consisting of CrSi, $CrSi_2$, $Cr_3Si$ and $Cr_5Si_3$, more preferably comprises at least one selected from the group consisting of CrSi, $CrSi_2$ and $Cr_3Si$ and is still more preferably CrSi, $Cr_3Si$ and $Cr_5Si_3$. Alternatively, the sintered body more preferably comprises CrSi, $Cr_3Si$ and silicon carbide. In addition, the sintered body preferably has a relative density of 90% or more, more preferably 93% or more and 100% or less. In addition, the sintered body preferably has a flexural strength of 150 MPa or more and 250 MPa or less, more preferably 180 MPa or more and 220 MPa or less.

The method for producing the sintered body according to the present invention can be performed by steps comprising (1) an alloy-raw-material-powder preparation step of mixing together powders of chromium, silicon and carbon and (2) a baking step of baking the resultant alloy-raw-material powder using a press-baking furnace such as a hot-press furnace at a pressure of 50 MPa or less at a baking temperature of 1200° C. to 1800° C.

Hereinafter, a method for producing the sintered body according to the present invention will be described step by step.

(1) Alloy-Raw-Material Preparation Step

The raw materials used in the alloy-raw-material preparation step (hereafter, also referred to as "starting materials") are chromium, silicon and carbon.

The chromium is preferably high-purity chromium and may be, for example, 3N (purity: 99.9% or more) or 4N (purity: 99.99% or more) chromium.

The silicon is preferably high-purity silicon and may be, for example, 3N (purity: 99.9% or more), 4N (purity: 99.99% or more), or 5N (purity: 99.999% or more) silicon.

The carbon (carbon source), which is carbon (C) and a compound thereof, is preferably carbide of at least one of chromium or silicon and may be at least one selected from the group consisting of chromium carbide ($Cr_3C_2$), silicon carbide (SiC) and carbon (C) or at least one of chromium carbide or silicon carbide. The chromium carbide and the silicon carbide can also be respectively regarded as the chromium and silicon starting materials.

The starting materials can be, for example, chromium (Cr), silicon (Si), chromium carbide ($Cr_3C_2$), silicon carbide (SiC) and carbon (C).

The starting materials may include, in addition to chromium and silicon or instead of chromium and silicon, an alloy of chromium and silicon and preferably includes a molten-metal powder of chromium and silicon.

In the present invention, "molten-metal powder" is a powder in which molten metal has been cooled, or a powder in which molten metal has been rapidly cooled and a powder having a fine structure. The molten-metal powder is, for example, a powder prepared by at least one selected from the group consisting of melt spinning, arc melting, gas atomization, water atomization, centrifugal atomization and vacuum atomization, a powder prepared by at least one selected from the group consisting of melt spinning, arc melting and gas atomization or a powder prepared by gas atomization. The molten-metal powder is a powder prepared without necessarily requiring a grinding step or a powder prepared without a grinding step and hence tends to have a lower impurity content than powders prepared with a grinding step.

The starting materials preferably include a powder prepared by gas atomization (hereafter, also referred to as "gas atomization powder") and particularly preferably include a gas atomization powder of chromium and silicon. Particles prepared by the gas atomization process have spherical shapes having about several tens of micrometers and have fine crystal phases within the spheres. The gas atomization powder is a powder composed of particles having a small surface area and a fine size and hence can be supplied as an alloy-raw-material powder that provides a post-bake sintered body having a low oxygen content and high strength, in other words, a sintered body that is low in oxygen content and is high in strength.

The gas atomization powder can be, for example, a powder having an average particle size of 5 μm or more and 100 μm or less, a powder having at least one of a spherical shape or a substantially spherical shape, a powder constituted by chromium silicide polycrystalline particles or a powder constituted by particles including chromium silicide polycrystals having different crystal phases.

The gas atomization powder preferably includes at least $CrSi_2$ as a crystal phase, more preferably includes at least one selected from the group consisting of Si, Cr, CrSi, $Cr_3C_2$ and $Cr_5Si_3$ and $CrSi_2$ as crystal phases and still more preferably includes at least one of Si or CrSi and $CrSi_2$ as crystal phases.

The conditions of the gas atomization process are not limited; for example, the treatment temperature at which chromium and silicon are melted is preferably set at the melting temperature+50 to 300° C., still more preferably at the melting temperature+100 to 250° C. This provides molten metal, in other words, metal in the form of liquid.

The "melting temperature" is the temperature at which a precursor substance such as a raw-material powder or flakes of chromium and silicon is melted and is a value unique to the material. The melting temperature can be, for example, 1300° C. to 1500° C. Thus, the treatment temperature can be, for example, 1350° C. or more and 1800° C. or less, 1350° C. or more, 1370° C. or more or 1390° C. or more, or 1800° C. or less, 1700° C. or less, 1550° C. or less or 1470° C. or less. When the difference between the melting temperature and the treatment temperature is small (for example, when the difference is less than 50° C.), of the two crystal phases, the phase having a higher melting point firstly precipitates, for example, so that it is difficult to reduce the size of alloy particles constituting the resultant powder. On the other hand, when the difference between the melting temperature and the treatment temperature is large, after atomization, particles are sintered together and the particles firmly adhere to the wall surface of the gas atomization apparatus, so that the powder recovery ratio becomes low (the yield becomes low).

In the gas atomization process, the precursor substance that provides a gas atomization powder of chromium and silicon supplied as the starting material can be supplied. The precursor substance can be at least one of chromium and silicon or compounds thereof, can be powders, flakes or bulks of chromium and silicon and is preferably flakes of chromium and silicon.

The chromium precursor substance is preferably high-purity chromium frames and may be, for example, 3N (purity: 99.9% or more) or 4N (purity: 99.99% or more) chromium flakes.

The silicon precursor substance is preferably high-purity silicon flakes and may be, for example, 3N (purity: 99.9% or more), 4N (purity: 99.99% or more) or 5N (purity: 99.999% or more) silicon flakes.

In the gas atomization process, the obtained molten metal is added dropwise to the gas flow so as to pass through the gas flow, to thereby obtain a gas atomization powder.

The gas flow can be an inert gas such as at least one selected from the group consisting of argon (Ar), nitrogen ($N_2$) and helium (He), or argon.

The pressure of the gas flow (hereafter, also referred to as "gas pressure") can be 1 MPa or more, 4 MPa or more or 6 MPa or more or can be 10 MPa or less or 9 MPa or less.

The gas atomization process can be at least the crucible mode or the electrode mode and is preferably the crucible mode. The crucible used in the crucible-mode gas atomization process is preferably, for example, a crucible formed of at least one selected from the group consisting of carbon, alumina, magnesia, silicon nitride, zirconia and boron nitride or a crucible in which the main body formed of at least one selected from the group consisting of carbon, alumina, magnesia and zirconia is coated with at least one of boron nitride or silicon carbide.

The powder resulted from gas atomization (gas atomization powder) is preferably kept (stored) in a vacuum atmosphere or in an inert atmosphere such as nitrogen or argon and is preferably not exposed to an oxidizing atmosphere until it is supplied to the subsequent baking step. When the powder is exposed to an oxidizing atmosphere, for example, left in the air, oxidation occurs from the surface of the atomization powder, which results in an increased oxygen content of the powder.

Incidentally, it is known that, instead of the use of molten-metal powder, a mixed powder obtained by mixing together chromium and silicon by a powder mixing method is used as the starting material for a sintered body. For example, fine powder mixing (physical mixing of fine powders) can also achieve production of a high-strength sintered body. However, the powder obtained by this method is baked to provide a sintered body having a high oxygen content. By contrast, mixing of coarse particles (physical mixing of powders including coarse particles) can provide a sintered body having a low oxygen content, but it has low strength. Examples of other methods of producing the raw material (molten-metal powder) include rapid cooling methods such as melt spinning and arc melting.

The starting materials preferably have a low oxygen content. When the starting materials have a high oxygen content, a sputtering target using the sintered body according to the present invention has a high oxygen content. Such a high oxygen content tends to cause generation of particles. The oxygen content of each of the starting materials is preferably 0.5 wt % or less or 0.1 wt % or less or can be 0 wt % or more, more than 0 wt % or 0.01 wt % or more, for example.

Particularly preferably the starting materials supplied to the alloy-raw-material preparation step may be a gas atomization powder of chromium and silicon and carbides of chromium and silicon, or a gas atomization powder of chromium and silicon and chromium carbide.

The shapes of the starting materials are not limited and may be powders.

The method of mixing together powders (starting materials) is a method by which the starting materials are uniformly mixed together and any mixing machine such as a V-type mixing or a mixer can be used. The mixing method can be at least dry mixing or wet mixing and is preferably dry mixing, more preferably dry mixing using a V-type mixer. This provides the alloy-raw-material powder.

The mixing atmosphere is preferably an atmosphere in which the starting materials are less likely to be oxidized and may be at least a vacuum atmosphere or an inert atmosphere, at least a nitrogen atmosphere or an argon atmosphere or an argon atmosphere.

For the rotation rate, stirring rate, or the like of the mixing machine, the mixing rate may be 10 rpm or more and 200 rpm or less, or 50 rpm or more and 100 rpm or less. The mixing time may be 30 minutes or more and 5 hours or less, or 45 minutes or more and 3 hours or less.

The raw material (alloy-raw-material powder) obtained by the alloy-raw-material preparation step preferably has a purity of 99% or more, more preferably 99.9% or more. When the raw-material-alloy powder has a high impurity content (in other words, has a low purity), such impurities tend to cause abnormal grain growth in the baking step. The abnormally grown grains tend to become the source of generating particles during formation of a film.

The alloy-raw-material preparation step is preferably a step of mixing together starting materials including a molten-metal powder of chromium and silicon (molten-alloy powder of chromium-silicon) and a carbon source in at least a vacuum atmosphere or an inert atmosphere to obtain an alloy-raw-material powder. The molten-metal powder is preferably a gas atomization powder of chromium and silicon. The carbon source preferably includes a carbide including at least one of chromium or silicon, more preferably at least one of chromium carbide ($Cr_3C_2$) or silicon carbide (SiC), still more preferably chromium carbide.

(2) Baking Step

In the baking step, the obtained alloy-raw-material powder is baked using a press-baking furnace such as a hot-press furnace at a pressure of 50 MPa or less at a baking temperature of 1200° C. to 1800° C. The baking is performed preferably with a press-baking furnace such as a hot-press furnace. Because silicon has a small diffusion coefficient, it is difficult to provide, using a non-pressure furnace, a sintered body having an increased density.

In the baking step, press-baking is performed to bake the alloy-raw-material powder. In the step, the press-baking may be at least hot pressing or hot isostatic pressing and is preferably hot pressing.

During baking, the hot-press pressure (hereafter, also simply referred to as "pressure") is preferably set to 50 MPa or less. When the pressure is more than 50 MPa, it is difficult to prepare a hot-press die (press die) usable under application of pressure (general-purpose dies are not suitably used). The general-purpose dies are dies formed of carbon, for example.

In order to produce a large sintered body, the hot-press pressure is preferably 5 to 45 MPa, more preferably 10 to 40 MPa, particularly preferably 15 to 40 MPa. In this step, the hot-press pressure is preferably 5 MPa or more, 10 MPa or more or 15 MPa or more, and 50 MPa or less, 45 MPa or less or 40 MPa or less.

The baking temperature is set to 1350° C. to 1800° C. When the baking temperature is less than 1350° C., the resultant sintered body does not have a sufficiently increased density. On the other hand, when the baking temperature is more than 1800° C., the material (sintered body) being baked may be melted. The baking temperature is particularly preferably 1300° C. or more, 1325° C. or more or 1350° C. or more, and 1800° C. or less, 1600° C. or less or 1400° C. or less.

The heating rate and the cooling rate are not particularly limited and can be appropriately determined in consideration of the volume of the baking furnace and the size, shape, or ease of cracking of the sintered body, for example. The heating rate is, for example, 100° C./hour or more or 150° C./hour or more, or 300° C./hour or less or 250 hour or less.

The holding time during baking can be set to, for example, 1 to 5 hours or 1.5 hours or more and 3.5 hours or less. When the holding time is set to 1 hour or more, temperature variations in the baking furnace and the hot-press die (press die) are suppressed and a sintered body having a homogeneous structure tends to be obtained. When the holding time is 5 hours or less, sintering at industrial productivity can be achieved.

The baking atmosphere is preferably a vacuum atmosphere, a vacuum reduced-pressure atmosphere, or an inert atmosphere such as argon, more preferably an argon atmosphere or a vacuum atmosphere, still more preferably a vacuum atmosphere. When the baking is performed in a vacuum atmosphere, a sintered body having the same composition as the raw-material-alloy powder tends to be obtained. Note that, in the present invention, the vacuum atmosphere and the vacuum reduced-pressure atmosphere are used interchangeably.

The baking step is particularly preferably a step of press-baking the alloy-raw-material powder in a vacuum atmosphere, at a pressure of 50 MPa or less and at a baking temperature of 1350° C. or more and 1800° C. or less. The press-baking is preferably a hot-press treatment, or the alloy-raw-material powder preferably includes a molten-metal powder of chromium and silicon and is more preferably a powder composition including a molten-metal powder of chromium and silicon and a carbide of at least one of chromium or silicon.

The method for producing the sintered body according to the present invention is particularly preferably a production method comprising a step of mixing together a gas atomization powder of chromium and silicon and a carbon source including at least one of chromium or silicon and carbon to obtain an alloy-raw-material powder and a baking step of hot-pressing the alloy-raw-material powder in a vacuum atmosphere, at a pressure of 50 MPa or less and at a baking temperature of 1350° C. or more and 1800° C. or less. The carbon source is preferably a carbide including at least one of chromium or silicon, more preferably chromium carbide.

The sintered body according to the present invention can be ground into a plate shape using a machining apparatus such as a surface grinder, a cylindrical grinder, a lathe, a cutting machine, or a machining center. In this way, the sintered body can be processed into an appropriate shape corresponding to the purpose.

The sintered body according to the present invention can be used in publicly known applications of silicides such as structural materials, electrode materials and semiconductor materials and is particularly preferably used as a sputtering target (hereafter, also simply referred to as "target").

A sputtering target formed of the sintered body according to the present invention can be provided.

The method for producing the sputtering target is not limited and the sintered body according to the present invention may be directly used as a sputtering target. Alternatively, as needed, to a backing plate formed of oxygen-free copper, titanium, or the like and a backing tube, indium solder or the like can be used to bond together (bond) the sintered body according to the present invention and the backing plate, so that the sintered body according to the present invention can be turned into a sputtering target.

Furthermore, the obtained sputtering target can be used to perform sputtering to thereby produce a film (thin film). In other words, the sintered body according to the present invention can be turned into a sputtering target comprising the sintered body according to the present invention, a backing plate and a backing tube or can be used for a method for producing a film by sputtering using the sputtering target.

The conditions of the sputtering are not limited, but may be, for example, the following conditions.

Film-formation power: 100 W or more and 800 W or less, preferably 150 W or more and 300 W or less Gas pressure: 0.2 Pa or more and 1.0 Pa or less, preferably 0.3 Pa or more and 0.7 Pa or less Gas atmosphere: inert atmosphere, preferably argon atmosphere Film-formation time: 0.5 hours or more and 3 hours or less, preferably 0.5 hours or more and 1.5 hours or less In order to reduce the temperature dependency of the resistivity, the post-sputtering film is preferably subjected to heat treatment (annealing treatment). The conditions of the annealing treatment may be the following conditions.

Annealing atmosphere: vacuum atmosphere

Annealing time: 1 hour

Annealing temperature: appropriate temperature in 200° C. to 600° C.

The film obtained using the sintered body according to the present invention (hereafter, also referred to as "the film according to the present invention") has an appropriate thickness and the film thickness may be, for example, 5 nm or more or 10 nm or more, or 1 μm or less or 500 nm or less.

The film according to the present invention is a Si—Cr—C-based film, an amorphous film composed of chromium silicide and at least one selected from the group consisting of chromium carbide, silicon carbide and carbon and is preferably an amorphous film composed of chromium silicide and silicon carbide or carbon.

The film according to the present invention is a film present on a substrate, in other words, a film formed on a substrate, in particular, a sputtered film. Thus, the film according to the present invention is different from free-standing films and can also be regarded as a laminated body in which the film according to the present invention and the substrate are laminated together. The substrate is a substrate composed of an appropriate material corresponding to the purpose and may be a substrate composed of at least one selected from the group consisting of metal, semimetal, ceramic, glass and a polymer, a substrate composed of at least one selected from the group consisting of metal, semimetal and glass or a substrate composed of glass.

In the film according to the present invention, the change ratio of the resistivity in response to a change of 1° C. in the temperature of the film, what is called, the temperature coefficient of resistance (Temperature Coefficient of Resistance; hereafter, also referred to as "TCR") is preferably small; the maximum value of TCR in the measurement temperatures of 40° C. to 150° C. (hereafter, also referred to as "maximum TCR") is preferably 100 ppm/° C. or less or 98 ppm/° C. or less.

The minimum value of TCR in the measurement temperatures of 40° C. to 150° C. (hereafter, also referred to as "minimum TCR") may be −25 ppm/° C. or more or 0 ppm/° C. or more.

In the present invention, TCR is the resistivity value of a film measured using an ordinary resistivity measurement apparatus (for example, model 8403 AC/DC Hall measurement system, manufactured by TOYO Corporation) and can be calculated by the following formula.

$$TCR = (R - R_{30}) / \{R_{30} \times (T - 30)\} \times 10^6$$

In this formula, TCR is the temperature coefficient of resistance [ppm/° C.], R is the resistivity [Ω·cm] at the measurement temperature, $R_{30}$ is the resistivity [ω·cm] at 30° C. and T is the measurement temperature [° C.].

In the film according to the present invention, the average of TCR in the measurement temperatures of 40° C. to 150° C. (hereafter, also referred to as "average TCR") is preferably 100 ppm/° C. or less, 50 ppm/° C. or less or 15 ppm/° C. or less. The average TCR may be 0 ppm/° C. or more, 1 ppm/° C. or more or 10 ppm/° C. or more.

The average TCR is the average of absolute values of TCR measured every 10° C. in the measurement temperatures of 40° C. to 150° C. and can be calculated by the following formula.

$$\text{Average TCR}=(\text{TCR}_{40}+\text{TCR}_{50}+\ldots+\text{TCR}_{150})/12$$

In this formula, $\text{TCR}_{40}$ is the absolute value [ppm/° C.] of TCR at the measurement temperature of 40° C., $\text{TCR}_{50}$ is the absolute value [ppm/° C.] of TCR at the measurement temperature of 50° C., and the like, which are the absolute values [ppm/° C.] of TCR measured every 10° C. at the measurement temperatures.

In the film according to the present invention, the gradient of the straight line of the first order approximation formula (linear approximation) obtained from 13 plotted points of TCR measured every 10° C. in the temperature range of 30° C. to 150° C. (hereafter, also referred to as "TCR gradient") is preferably ±0.7 ppm/° C.$^2$ and is preferably ±0.5 ppm/° C.$^2$, ±0.3 ppm/° C.$^2$, ±0.2 ppm/° C.$^2$, ±0.1 ppm/° C.$^2$ or 0 (zero) ppm/° C.$^2$. When the TCR gradient is in such a range, in the applications of sensors used in environments in which the temperature considerably changes such as car-mounted sensors, the detection sensitivity is stabilized.

EXAMPLES

Hereinafter, the present invention will be described further in detail with reference to Examples; however, the present invention is not limited to these. Note that measurements in EXAMPLES were performed in the following manner.
(1) Crystal Phases of Sintered Body For the crystal phases of a sintered body, an XRD pattern was measured under the above-described conditions and identification was performed.
(2) Relative Density of Sintered Body The relative density of a sintered body was determined as a ratio (%) of the measured density to the true density. First, a bulk density was determined in accordance with JIS R 1634, from the dry mass relative to the volume measured by the Archimedes' method, and this was defined as the measured density.

The true density was calculated by the following formula.

$$d=1/\{(R_1/M_1)+(R_2/M_2)+(R_3/M_3)+(R_4/M_4)+(R_5/M_5)+\\(R_6/M_6)+(R_7/M_7)+(R_8/M_8)+(R_9/M_9)\}$$

In this formula, d is the true density [g/cm$^3$] of the sintered body, $M_1$ to $M_8$ and $R_1$ to $R_9$ are respectively the true densities [g/cm$^3$] and mass ratios [wt %] of Si, C, Cr, SiC, CrSi, $CrSi_2$, $Cr_3Si$, $Cr_3C_2$ and $Cr_5Si_3$ comprised in the sintered body.

The crystal phases included in the sintered body were identified using an XRD pattern measured under the above-described conditions; the composition of the sintered body was determined by ICP analysis. From the measured elements and the obtained crystal phases, the mass ratios of the crystal phases were determined.

In the case of a sintered body constituted by three phases, the true density of the sintered body was calculated by the following formula where a crystal phase A has a mass a [g], a crystal phase B has a mass b [g], a crystal phase C has a mass c [g] and the phases respectively have true densities Ma [g/cm$^3$], Mb [g/cm$^3$] and Mc [g/cm$^3$].

$$d=(a+b+c)/((a/Ma)+(b/Mb)+(c/Mc))$$

(3) Porosity of Sintered Body

Mirror polishing was performed, observation using a laser microscope was performed and the resultant image of the structure of the sintered body was subjected to image analysis to perform measurement. The mirror polishing was performed using DP-Suspension, 1 μm (manufactured by Marumoto Struers K.K.) so as to achieve surface roughness Ra≤2 μm. At least random 5 fields of view were observed and subjected to image analysis to calculate the areas of pores; porosities were measured 5 times (specifically, once per field of view) and the average of measurement results of porosities of the fields of view was determined as the porosity.

Measured fields of view (magnification of observation): 200×

$$\text{Porosity (\%) of each field of view}=(\text{area of pores}\\\text{calculated by image analysis/measured area})\times\\100$$

(4) Number of Coarse Pores

From a random region of a sintered body, a sintered body having a diameter of 10.16 cm was cut out and subjected to In bonding to provide a sputtering target. A sputtering test was performed under the following conditions and, in the post-sputtering target, the number of pores having a maximum length of 50 μm or more was counted, using a laser microscope, as coarse pores.
(5) Oxygen Content The surface of a sintered body was ground by 1 mm or more and subsequently a sample (a quadrangular prism shape having a height of 3 mm, a width of 20 mm and a thickness of 4 mm) cut out from a random portion of the sintered body was measured in terms of oxygen content by the infrared absorption method after fusion.

Measurement method: infrared absorption method after impulse-furnace fusion

Apparatus: LECO ON736 oxygen-nitrogen analyzer
(6) Flexural Strength

The flexural strength of a sintered body was measured by the method in accordance with JIS R 1601.

Test method: 3-point bending test

Span between specimen supports: 30 mm

Specimen size: 3×4×40 mm

Head speed: 0.5 mm/min

Example 1

As precursor substances, Cr flakes (4N): 33 wt % and Si flakes (5N): 67 wt % were used. In a carbon crucible, the Cr flakes and the Si flakes were melted at a treatment temperature of 1650° C. to obtain molten metal of chromium and silicon. Subsequently, a gas atomization process was performed by adding dropwise the molten metal so as to pass through an argon gas flow at a gas pressure of 7 MPa to thereby prepare a powder (gas atomization powder), which was defined as the starting material of chromium and silicon. The gas atomization powder had crystal phases formed of $CrSi_2$ and Si. Subsequently, the gas atomization powder and a $Cr_3C_2$ powder (product name: Chromium Carbide, manufactured by PPM Ltd.) were mixed together by dry mixing in an argon atmosphere using a V-type mixer at 60 rpm for 1 hour so as to satisfy 62 wt % of the gas atomization powder and 38 wt % of the $Cr_3C_2$ powder, to provide an alloy-raw-material powder including 55 wt % of Cr, 39 wt % of Si and 6 wt % of C.

Subsequently, this alloy-raw-material powder was placed into a die formed of carbon (press die: diameter of 15.2 cm) and baked by a hot-press method to obtain the sintered body of this Example. The baking conditions are as follows.

Baking furnace: hot-press furnace

Heating rate: 200° C./hour

Heating atmosphere: vacuum reduced-pressure atmosphere (vacuum atmosphere)

Baking atmosphere: vacuum reduced-pressure atmosphere (vacuum atmosphere)

Baking temperature: 1350° C.

Pressure: 40 MPa

Baking time: 3 hours

This provided a microcrack-free, disc-shaped sintered body having sintered-body sizes of a diameter of 15.2 cm and a thickness of 7 mm.

The result of an XRD measurement demonstrated that the sintered body of this Example was a Cr—Si—C-based sintered body composed of CrSi, $Cr_5Si_3$ and SiC. From the XRD measurement result, the relative density of the sintered body of this Example was calculated using the true density calculated with 52 wt % of a crystal phase A: CrSi (true density: 5.36 [g/cm$^3$]), 27 wt % of a crystal phase B: $Cr_5Si_3$ (true density: 5.87/cm$^3$]) and 21 wt % of a crystal phase C: SiC (true density: 3.21/cm$^3$]).

Examples 2 to 7

The same method as in Example 1 was performed except that the baking conditions were changed to conditions described in Table 1, to produce sintered bodies (Cr—Si—C-based sintered bodies). The obtained sintered bodies were all Cr—Si—C-based sintered bodies composed of CrSi, $Cr_5Si_3$ and SiC.

Example 8

As precursor substances, Cr flakes (4N): 59 wt % and Si flakes (5N): 41 wt % were used. These were melted within a carbon crucible at a treatment temperature of 1650° C. to obtain molten metal. The molten metal was added dropwise so as to pass through an argon gas flow at a gas pressure of 7 MPa to thereby produce a gas atomization powder by a gas atomization process. The gas atomization powder had crystal phases composed of $CrSi_2$ and CrSi. Subsequently, mixing was performed by the same method as in Example 1 except that a $Cr_3C_2$ powder and the gas atomization powder were mixed together so as to satisfy 62 wt % of the gas atomization powder and 36 wt % of the $Cr_3C_2$ powder, to provide an alloy-raw-material powder of this Example including 69 wt % of Cr, 26 wt % of Si and 5 wt % of C.

Baking was performed by the same method as in Example 1 except that the alloy-raw-material powder was used, to obtain a Cr—Si—C-based sintered body, which was defined as the sintered body of this Example. From the XRD measurement result, the relative density of the sintered body was calculated using the true density calculated with 23 wt % of a crystal phase A: $Cr_5Si_3$ (true density: 5.87 [g/cm$^3$]), 61 wt % of a crystal phase B: $Cr_3Si$ (true density: 6.46/cm$^3$]) and 16 wt % of a crystal phase C: SiC (true density: 3.21/cm$^3$]).

Example 9

As precursor substances, Cr flakes (4N): 42 wt % and Si flakes (5N): 58 wt % were used. These were melted within a carbon crucible at a treatment temperature of 1650° C. to obtain molten metal. The molten metal was added dropwise so as to pass through an argon gas flow at a gas pressure of 7 MPa, to thereby produce a gas atomization powder by a gas atomization process. The gas atomization powder had crystal phases formed of $CrSi_2$ and Si. Subsequently, mixing was performed by the same method as in Example 1 except that a C powder and the gas atomization powder were mixed together so as to satisfy 95 wt % of the gas atomization powder and 5 wt % of the C powder, to provide an alloy-raw-material powder of this Example including 40 wt % of Cr, 55 wt % of Si and 5 wt % of C.

Baking was performed by the same method as in Example 1 except that the alloy-raw-material powder was used, to obtain a microcrack-free, disc-shaped sintered body having sintered-body sizes of a diameter of 15.2 cm and a thickness of 7 mm, which was defined as the sintered body of this Example.

The result of an XRD measurement demonstrated that the sintered body of this Example was a Cr—Si—C-based sintered body composed of $CrSi_2$, Si and C. From the result of the XRD measurement result, the relative density of the sintered body of this Example was calculated using the true density calculated with 83 wt % of $CrSi_2$, 12 wt % of Si and 5 wt % of C.

Example 10

The same method as in Example 9 was performed except that the C powder and the gas atomization powder were mixed together so as to satisfy 15 wt % of the C powder, to provide an alloy-raw-material powder of this Example including 36 wt % of Cr, 49 wt % of Si and 15 wt % of C.

Baking was performed by the same method as in Example 1 except that the alloy-raw-material powder was used, to provide a microcrack-free, disc-shaped sintered body having sintered-body sizes of a diameter of 15.2 cm and a thickness of 7 mm.

The result of an XRD measurement demonstrated that the sintered body of this Example was a Cr—Si—C-based sintered body composed of $CrSi_2$, Si and C. From the result of the XRD measurement result, the relative density of the sintered body of this Example was calculated using the true density calculated with 74 wt % of $CrSi_2$, 11 wt % of Si and 15 wt % of C.

Comparative Example 1

The same method as in Example 1 was performed except that a Cr powder: 31 wt %, a $CrSi_2$ powder: 48 wt % and a SiC powder: 21 wt % were subjected to powder mixing using a V-type mixer to provide an alloy-raw-material powder, to provide a sintered body constituted by crystal phases of CrSi, $Cr_5Si_3$ and SiC.

Comparative Example 2

The same method as in Example 9 was performed to provide a gas atomization powder including 42 wt % of Cr and 58 wt % of Si and having crystal phases formed of $CrSi_2$ and Si.

The same method as in Comparative Example 1 was performed except that the gas atomization powder was used, the baking temperature was set to 1250° C. and the pressure was set to 15 MPa, to produce a sintered body.

From the result of an XRD measurement, the sintered body of this Example was identified as a Cr—Si-based sintered body composed of $CrSi_2$ and Si (sintered body of chromium silicide). From the XRD measurement result and the result of ICP composition analysis, the relative density of the sintered body of this Comparative Example was calculated using the true density calculated with 87 wt % of $CrSi_2$ and 13 wt % of Si.

The production conditions of Examples 1 to 10 and Comparative Examples 1 and 2 are described in Table 1 and the evaluation results of the resultant sintered bodies are described in Table 2.

target and formation of a film (sputtering) was performed on a glass substrate (product name: Alkali-free glass C, manufactured by Mitsuru Optical Co., Ltd.) under the following conditions.

Film-formation power: 800 W

Gas pressure: 0.5 Pa

Gas atmosphere: Ar alone (argon atmosphere)

Film-formation time: 1 hour

After the film formation, the target was subjected to surface observation using a laser microscope. As a result, it was confirmed that, in such targets of Examples, pores having pore sizes of 50 μm or more (coarse pores) were not generated.

TABLE 1

| | Composition of alloy-raw-material powder (wt %) | | | Crystal phases of mixed powder (crystal phases of alloy-raw-material powder) | Sintered-body size | Baking step | | |
|---|---|---|---|---|---|---|---|---|
| | Cr | Si | C | | | Temperature (° C.) | Pressure (MPa) | Holding time (hour) |
| Example 1 | 55 | 39 | 6 | $CrSi_2$ + Si + $Cr_3C_2$ | 15.2 cmφ | 1350 | 40 | 3 |
| Example 2 | 55 | 39 | 6 | $CrSi_2$ + Si + $Cr_3C_2$ | 15.2 cmφ | 1350 | 15 | 3 |
| Example 3 | 55 | 39 | 6 | $CrSi_2$ + Si + $Cr_3C_2$ | 15.2 cmφ | 1375 | 15 | 3 |
| Example 4 | 55 | 39 | 6 | $CrSi_2$ + Si + $Cr_3C_2$ | 15.2 cmφ | 1400 | 15 | 3 |
| Example 5 | 55 | 39 | 6 | $CrSi_2$ + Si + $Cr_3C_2$ | 15.2 cmφ | 1425 | 15 | 3 |
| Example 6 | 55 | 39 | 6 | $CrSi_2$ + Si + $Cr_3C_2$ | 15.2 cmφ | 1450 | 15 | 3 |
| Example 7 | 55 | 39 | 6 | $CrSi_2$ + Si + $Cr_3C_2$ | 15.2 cmφ | 1500 | 15 | 3 |
| Example 8 | 69 | 26 | 5 | $CrSi_2$ + CrSi + $Cr_3C_2$ | 15.2 cmφ | 1500 | 15 | 3 |
| Example 9 | 40 | 55 | 5 | $CrSi_2$ + Si + C | 15.2 cmφ | 1350 | 15 | 3 |
| Example 10 | 36 | 49 | 15 | $CrSi_2$ + Si + C | 15.2 cmφ | 1350 | 40 | 3 |
| Comparative Example 1 | 55 | 39 | 6 | Cr + $CrSi_2$ + SiC | 15.2 cmφ | 1350 | 40 | 3 |
| Comparative Example 2 | 42 | 58 | — | $CrSi_2$ + Si | 15.2 cmφ | 1250 | 15 | 3 |

TABLE 2

| | Crystal phases | Density (relative density: %) | Porosity (%) | Flexural strength (MPa) | Oxygen content (wt %) |
|---|---|---|---|---|---|
| Example 1 | CrSi + $Cr_5Si_3$ + SiC | 98.7 | 0.7 | 203 | 0.08 |
| Example 2 | CrSi + $Cr_5Si_3$ + SiC | 90.2 | 12.6 | 162 | — |
| Example 3 | CrSi + $Cr_5Si_3$ + SiC | 92.1 | 10.9 | 166 | — |
| Example 4 | CrSi + $Cr_5Si_3$ + SiC | 92.6 | 9.7 | 175 | — |
| Example 5 | CrSi + $Cr_5Si_3$ + SiC | 94.8 | 5.7 | 202 | — |
| Example 6 | CrSi + $Cr_5Si_3$ + SiC | 95.9 | 5.2 | 207 | — |
| Example 7 | CrSi + $Cr_5Si_3$ + SiC | 98.4 | 0.9 | 212 | — |
| Example 8 | $Cr_3Si$ + $Cr_5Si_3$ + SiC | 95.7 | 9.3 | 186 | 0.10 |
| Example 9 | $CrSi_2$ + Si + C | 91.5 | 7.8 | | |
| Example 10 | $CrSi_2$ + Si + C | 95.2 | 5.5 | | |
| Comparative Example 1 | CrSi + $Cr_5Si_3$ + SiC | 87.5 | 16.1 | 104 | 0.63 |
| Comparative Example 2 | $CrSi_2$ + Si | 99.8 | 1.2 | | |

TABLE 3

| | Coarse pores (pores) |
|---|---|
| Example 1 | 0 |
| Example 8 | 0 |
| Comparative Example 1 | 43 |

<Inspection of Coarse Pores>

The sintered bodies of Examples 1 and 8 and Comparative Example 1 were each lathed and, from such a sintered body, a disc-shaped sintered body having a diameter of 10.16 mm and a thickness of 5 mm was cut out. The obtained sintered body was bonded to a backing plate to provide a sputtering <Film Formation>

The same method as in <Inspection of coarse pores> was carried out to perform sputtering to form a film except that the sintered bodies of Examples 7, 9 and 10 and Comparative Example 2 were used and the following conditions were applied.

Film-formation power: 200 W

Gas pressure: 0.5 Pa

Gas atmosphere: argon atmosphere

Film-formation time: 1 hour

The film formation was performed plural times to obtain plural films (sputtered films). The obtained films (sputtered films) were individually subjected to an annealing treatment in a vacuum atmosphere, for 1 hour and at any one of temperatures in increments of 10° C. in the range of 200° C. to 600° C. This provided, for each of the Examples, plural sputtered films having a film thickness of 100 nm. The films after the annealing treatment were evaluated under the following conditions.

(Resistivity)

The resistivity of such a film was measured using a model 8403 AC/DC Hall measurement system (manufactured by TOYO Corporation) at 30° C. The measurement was performed for a sample having 1 cm sides and cut out from the glass substrate having the sputtered film.

(TCR)

The resistivity of the film was measured every 10° C. from 30° C. to 150° C. and TCR at each temperature was calculated by the following formula.

$$\text{TCR (ppm/}^\circ\text{ C.)} = (R - R_{30})/(R_{30} \times (T - 30)) \times 10^6$$

Of TCR measured in 40° C. to 150° C., the maximum value was defined as maximum TCR, the minimum value was defined as minimum TCR and the average of the absolute values of TCR was defined as average TCR.

(TCR Gradient)

The values of TCR determined in 40° C. to 150° C. in the TCR measurement were plotted in temperature-TCR and, from the plots, a first order linear approximation formula was determined. The value of the gradient of the first order linear approximation formula was determined as TCR gradient.

The annealing temperature at which the value of the average TCR becomes minimum and the evaluation results of the film after being subjected to the annealing treatment at the annealing temperature will be described in the following Table.

TABLE 4

| | Annealing temperature (° C.) | Resistivity ($\Omega \cdot$ cm) | Average TCR (ppm/° C.) | Maximum TCR (ppm/° C.) | Minimum TCR (ppm/° C.) | TCR gradient (ppm/° C.$^2$) |
|---|---|---|---|---|---|---|
| Example 7 | 420 | 290 | 4 | 9 | 4 | −0.12 |
| Example 9 | 380 | 898 | 77 | 97 | 55 | −0.38 |
| Example 10 | 510 | 1009 | 9 | 6 | −20 | −0.21 |
| Comparative Example 2 | 230 | 1170 | 64 | 104 | 17 | −0.78 |

Tables above have demonstrated that, compared with the Examples, Comparative Example 2 has a high relative density and a low porosity, but the resultant films have a high TCR gradient and the resistivity changes considerably in response to temperature change.

The entire contents of Descriptions, Claims and Abstracts of JP2020-129947 filed in the Japan Patent Office on Jul. 31, 2020 and JP2021-63955 filed in the Japan Patent Office on Apr. 5, 2021 are incorporated herein by reference as disclosure of DESCRIPTION of the present disclosure.

REFERENCE SIGNS LIST

100 observation image
10 black region (pore)
11 white region (sintered body)

The invention claimed is:

1. A sintered body, consisting of:
1 to 20 wt % carbon;
20 to 70 wt % silicon; and
chromium (Cr),
wherein the sintered body has a relative density of 90% or more and a porosity of 13% or less.

2. The sintered body according to claim 1, wherein the sintered body includes chromium silicide and at least one selected from the group consisting of chromium carbide, silicon carbide and carbon.

3. The sintered body according to claim 1, wherein the sintered body has a main phase comprising at least one selected from the group consisting of CrSi, CrSi$_2$ and Cr$_3$Si.

4. The sintered body according to claim 1, wherein the sintered body has an oxygen content of 1 wt % or less.

5. The sintered body according to claim 1, wherein the sintered body has a flexural strength of 100 MPa or more.

6. A method for producing the sintered body of claim 1, comprising:
mixing a gas atomization powder of chromium and silicon with a carbon source including carbon and at least one of chromium or silicon to obtain an alloy-raw-material powder; and
hot-pressing the alloy-raw-material powder in a vacuum atmosphere, at a pressure of 50 MPa or less and a baking temperature of 1350° C.-1800° C.

7. The method according to claim 6, wherein the carbon source comprises a carbide including at least one of chromium or silicon.

8. A sputtering target, comprising:
the sintered body of claim 1.

9. A method for producing a film, comprising:
sputtering using the sputtering target of claim 8.

10. The sintered body according to claim 2, wherein the sintered body has a main phase comprising at least one selected from the group consisting of CrSi, CrSi$_2$ and Cr$_3$Si.

11. The sintered body according to claim 2, wherein the sintered body has an oxygen content of 1 wt % or less.

12. The sintered body according to claim 3, wherein the sintered body has an oxygen content of 1 wt % or less.

13. The sintered body according to claim 2, wherein the sintered body has a flexural strength of 100 MPa or more.

14. The sintered body according to claim 3, wherein the sintered body has a flexural strength of 100 MPa or more.

15. The sintered body according to claim 4, wherein the sintered body has a flexural strength of 100 MPa or more.

16. The sintered body according to claim 1, wherein the sintered body has a relative density of 90 to 95.9%.

17. The sintered body according to claim 1, wherein the sintered body has a porosity of 5.2 to 13%.

18. The sintered body according to claim 1, wherein the sintered body has a flexural strength of 180 MPa or more and 220 MPa or less.

19. The sintered body according to claim 1, wherein the sintered body has chromium content of more than 10 wt % and less than 79 wt %.

\* \* \* \* \*